United States Patent
Zhang et al.

(10) Patent No.: US 9,452,925 B2
(45) Date of Patent: Sep. 27, 2016

(54) METHOD OF INCREASING MEMS ENCLOSURE PRESSURE USING OUTGASSING MATERIAL

(71) Applicant: InvenSense, Inc., Sunnyvale, CA (US)

(72) Inventors: Cerina Zhang, Milpitas, CA (US); Martin Lim, San Mateo, CA (US); Jongwoo Shin, Pleasanton, CA (US); Joseph Seeger, Menlo Park, CA (US)

(73) Assignee: InvenSense, Inc., Sunnyvale, CA (US)

( * ) Notice: Subject to any disclaimer, the term of this patent is extended or adjusted under 35 U.S.C. 154(b) by 0 days.

(21) Appl. No.: 14/832,786

(22) Filed: Aug. 21, 2015

(65) Prior Publication Data

US 2015/0360939 A1 Dec. 17, 2015

Related U.S. Application Data

(63) Continuation-in-part of application No. 13/535,180, filed on Jun. 27, 2012.

(60) Provisional application No. 62/108,397, filed on Jan. 27, 2015, provisional application No. 61/501,652, filed on Jun. 27, 2011.

(51) Int. Cl.
*H01L 23/02* (2006.01)
*H01L 21/54* (2006.01)
*B81C 1/00* (2006.01)
*B81B 7/02* (2006.01)

(52) U.S. Cl.
CPC .............. *B81C 1/00246* (2013.01); *B81B 7/02* (2013.01); *B81C 1/0023* (2013.01); *B81C 1/00269* (2013.01); *B81C 2203/019* (2013.01); *B81C 2203/0145* (2013.01)

(58) Field of Classification Search
CPC ....... H01L 23/02; H01L 21/54; H01L 29/84; H01L 21/04
USPC ........ 257/415, 414, 416, 417, E23.193, 723, 257/E23.18, E21.501; 438/48–52, 438/455–459, 476
See application file for complete search history.

(56) References Cited

U.S. PATENT DOCUMENTS

| | | |
|---|---|---|
| 5,285,131 A | 2/1994 | Muller et al. |
| 5,493,177 A | 2/1996 | Muller et al. |
| 5,531,121 A | 7/1996 | Sparks et al. |
| 6,936,491 B2 | 8/2005 | Partridge et al. |
| 7,008,812 B1 | 3/2006 | Carley |
| 7,075,160 B2 | 7/2006 | Partridge et al. |
| 7,104,129 B2 | 9/2006 | Nasiri et al. |
| 7,442,570 B2 | 10/2008 | Nasiri et al. |

(Continued)

*Primary Examiner* — David Vu
*Assistant Examiner* — Mouloucoulaye Inoussa
(74) *Attorney, Agent, or Firm* — Sterne, Kessler, Goldstein & Fox P.L.L.C.

(57) ABSTRACT

Semiconductor manufacturing processes include providing a first substrate having a first passivation layer disposed above a patterned top-level metal layer, and further having a second passivation layer disposed over the first passivation layer; the second passivation layer has a top surface. The processes further include forming an opening in a first portion of the second passivation layer, and the opening exposes a portion of a surface of the first passivation layer. The processes further include patterning the second and first passivation layers to expose portions of the patterned top-level metal layer and bonding a second substrate and the first substrate to each other. The bonding occurs within a temperature range in which at least the exposed portion of the first passivation layer undergoes outgassing.

1 Claim, 11 Drawing Sheets

(56) References Cited

U.S. PATENT DOCUMENTS

| | | |
|---|---|---|
| 8,328,966 B1 | 12/2012 | Laib et al. |
| 9,067,779 B1 * | 6/2015 | Rothberg ............ B81C 1/00238 |
| 2003/0231967 A1 | 12/2003 | Najafi et al. |
| 2004/0077117 A1 * | 4/2004 | Ding ........................ B81B 7/007 438/51 |
| 2009/0294879 A1 | 12/2009 | Bhagavat et al. |
| 2010/0025845 A1 | 2/2010 | Merz et al. |
| 2011/0079425 A1 | 4/2011 | Baillin et al. |
| 2011/0121412 A1 | 5/2011 | Quevy et al. |
| 2012/0043627 A1 | 2/2012 | Lin et al. |
| 2012/0326248 A1 | 12/2012 | Daneman et al. |
| 2015/0129991 A1 | 5/2015 | Lee et al. |

\* cited by examiner

METHOD OF INCREASING MEMS ENCLOSURE PRESSURE USING OUTGASSING MATERIAL

CROSS-REFERENCE TO RELATED APPLICATIONS

This application is a continuation-in-part of U.S. application Ser. No. 13/535,180, filed Jun. 27, 2012, which claims the benefit of U.S. Provisional Application No. 61/501,652, filed Jun. 27, 2011, and also claims the benefit of U.S. Provisional Application No. 62/108,397, filed Jan. 27, 2015, the entirety of which are hereby incorporated by reference.

FIELD

The present disclosure relates generally to MEMS (micro-electro-mechanical systems) and more particularly to processes for making a plurality of hermetically-sealed integrated MEMS devices.

BACKGROUND

One of the main challenges in implementing multiple MEMS devices in a single chip is in providing more than one enclosure pressure within the single chip to optimize the performance of each sensor independently. For example, a gyro requires a low enclosure pressure to minimize damping whereas an accelerometer may require a high enclosure pressure for optimized performance.

BRIEF DESCRIPTION OF THE DRAWINGS

Aspects of this disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

Figure 1:
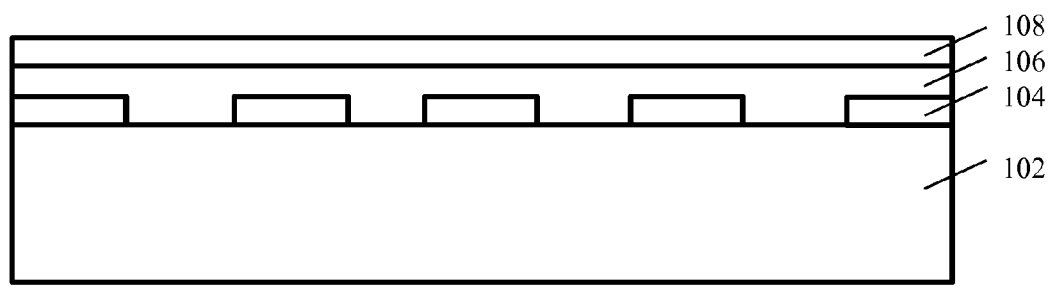
FIG. 1 is a cross-sectional representation of partially fabricated integrated MEMS devices having a first substrate in accordance with a first exemplary process.

Illustrative embodiments will now be described with reference to the accompanying drawings. In the drawings, generally, like reference numbers indicate identical or functionally similar elements. Additionally, the left-most digit(s) of a reference number identifies the drawing in which the reference number first appears.

DETAILED DESCRIPTION

The present disclosure relates generally to MEMS (micro-electro-mechanical systems) and more particularly to processes for making hermetically-sealed integrated MEMS devices.

The following Detailed Description refers to the accompanying drawings that illustrate exemplary embodiments consistent with this disclosure. The exemplary embodiments will so fully reveal the general nature of the disclosure that others can, by applying knowledge of those skilled in relevant art(s), readily modify and/or adapt for various applications such exemplary embodiments, without undue experimentation, without departing from the spirit and scope of the disclosure. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

The term "substrate" describes a material onto which subsequent material layers are added. In embodiments, the substrate itself may be patterned and materials added on top of it may also be patterned, or may remain without patterning. Furthermore, "substrate" may be any of a wide array of semiconductor materials such as silicon, germanium, gallium arsenide, indium phosphide, etc. In other embodiments, the substrate may be electrically non-conductive such as a glass or sapphire wafer.

A package provides electrical connection between the bond pads on the chip to, for example, a metal lead that can be soldered to a printed circuit board (PCB). A package typically comprises a substrate and a cover.

As used herein, integrated MEMS refers to MEMS that have been integrated with electronic circuits, such as ICs. Silicon wafers containing MEMS structures are referred to as MEMS wafers. MEMS substrate provides mechanical support for the MEMS structure. The MEMS structural layer is attached to the MEMS substrate. The MEMS substrate is also referred to as handle substrate or handle wafer. In some embodiments, the handle substrate serves as a cap to the MEMS structure. MEMS device may refer to a semiconductor device implemented as a micro-electro-mechanical system. A MEMS device includes mechanical elements and optionally includes electronics for sensing. MEMS devices include but are not limited to gyroscopes, accelerometers, magnetometers, and pressure sensors. MEMS features refer to elements formed by MEMS fabrication process such as bump stop, damping hole, via, port, plate, proof mass, standoff, spring, and seal ring. MEMS structure may refer to any feature that may be part of a larger MEMS device. One or more MEMS features comprising moveable elements is a MEMS structure.

In the described embodiments, an enclosure may refer to a fully enclosed volume typically surrounding the MEMS structure and typically formed by the IC substrate, structural layer, MEMS substrate, and the standoff seal ring. A cap or a cover provides mechanical protection to the structural layer and optionally forms a portion of the enclosure. A cavity refers to a recess in a substrate wafer.

As used herein, the term "standoff" refers to a structure. A standoff defines the vertical clearance between the structural layer and the IC substrate. A standoff may also provide electrical contact between the structural layer and the IC substrate. Further, a standoff may also provide a seal that defines an enclosure.

As used herein, the term "bonding" refers to methods of attaching. The MEMS substrate and the IC substrate may be bonded using eutectic bond (AlGe, CuSn, AuSi), fusion bond, compression, thermo-compression, adhesive bond, solder, anodic bonding, glass frit.

As used herein, the term "bond chamber" refers to a component of bonding equipment where the wafer bonding process takes place.

In the described embodiments, an electronic device incorporating a sensor may employ a motion tracking module also referred to as Motion Processing Unit (MPU) that includes at least one sensor in addition to electronic circuits. The sensor, such as a gyroscope, a compass, a magnetometer, an accelerometer, a microphone, a pressure sensor, a proximity sensor, or an ambient light sensor, among others, is contemplated.

Some embodiments that include an accelerometer, a gyroscope, and a magnetometer, which each provide a measurement along three axes that are orthogonal relative to each other are referred to as a 9-axis devices. Other embodiments may not include all the sensors or may provide measurements along one or more axes. The sensors may be formed on a first substrate. Other embodiments may include solid-state sensors or any other type of sensors. The electronic circuits in the MPU receive measurement outputs from the one or more sensors. In some embodiments, the electronic circuits process the sensor data. The electronic circuits may be implemented on a second silicon substrate. In some embodiments, the first substrate may be vertically stacked, attached and electrically connected to the second substrate in a single semiconductor chip, while in other embodiments, the first substrate may be disposed laterally and electrically connected to the second substrate in a single semiconductor package.

In one embodiment, the first substrate is attached to the second substrate through wafer bonding to simultaneously provide electrical connections and hermetically seal the MEMS devices. This fabrication technique advantageously enables technology that allows for the design and manufacture of high performance, multi-axis, inertial sensors in a very small and economical package. Integration at the wafer-level minimizes parasitic capacitances, allowing for improved signal-to-noise relative to a discrete solution. Such integration at the wafer-level also enables the incorporation of a rich feature set which minimizes the need for external amplification.

In the described embodiments, raw data refers to measurement outputs from the sensors which are not yet processed. Motion data refers to processed raw data. Processing may include applying a sensor fusion algorithm or applying any other algorithm. In the case of a sensor fusion algorithm, data from one or more sensors may be combined to provide an orientation of the device. In the described embodiments, an MPU may include processors, memory, control logic and sensors among structures.

Overview

Disclosed herein are processes of making hermetically sealed MEMS devices that are integrated with a CMOS IC. Various processes are described to form a plurality of hermetically sealed enclosures between a MEMS wafer and a CMOS wafer using eutectic solder as the bonding material. These processes fabricate two or more MEMS devices that perform optimally at different operating pressures or in different ambient gasses. For example, a first MEMS device may be a MEMS gyroscope which typically perform optimally at a low and stable enclosure pressure and a second MEMS device may be another sensor such as accelerometer which typically perform optimally at a higher enclosure pressure to operate.

To make a plurality of enclosures with different pressures and/or different ambient gasses, outgassing material is used. In an enclosure that requires a high pressure, a large area of the outgassing material is exposed. In an enclosure that requires a low pressure, a relatively small area, or none of the area, of the outgassing material is exposed by encapsulating the outgassing material with an outgassing barrier layer. Alternatively, some or all of the outgassing source layer is removed before the enclosure is formed. It is noted that the volume of outgassed material, dictating the pressure inside the enclosure, can be controlled by adjusting the exposed area, thickness, and outgassing content concentration of the outgassing material and/or by adjusting the heating temperature and duration. Therefore, the pressure inside each enclosure can be set individually to predetermined pressures, or ranges of pressures, using these methods. The pressure of one enclosure may exceed ten times the pressure of another enclosure.

Processes

In the process embodiments herein, even though the process steps are described as being performed in a stated order, particular process steps may be performed at different points in the process flow and in a different order with respect to other process steps as desired to achieve a similar resulting structure. In addition, one or more process steps can be substituted with alternative process steps that can also achieve a similar resulting structure. For example, the process steps of depositing a blanket layer and removing portions of the deposited layer from selected areas can be substituted with a process of selectively depositing the layer such that it is not deposited in the selected areas.

First Exemplary Process

FIG. 1 is a cross-sectional representation of partially fabricated integrated MEMS devices having a first substrate 102. The partially fabricated integrated MEMS devices of FIG. 1 include a first substrate 102, a patterned top-level metal layer 104, a first passivation layer 106, and a second passivation layer 108. In this illustrative embodiment, patterned top-level metal layer 104 is disposed on substrate 102, first passivation layer 106 is disposed on patterned top-level metal layer 104, and substrate 102. Second passivation layer 108 is disposed on first passivation layer 106.

In this embodiment, substrate 102 is a portion of a wafer containing electronic circuits, such as CMOS circuits, and patterned top-level metal layer 104 is the metal interconnect in the top-most interconnect level formed during back-end-of-line (BEOL) processes for the CMOS IC. In the embodiment of FIG. 1, patterned top-level metal layer 104 is substantially made of aluminum. In an alternative embodiment, top-level metal layer 104 and/or second passivation layer 108 may be layers formed during post-BEOL processes. In another alternative embodiment, substrate 102 top-level metal layer 104 is not present.

In an alternative embodiment, substrate 102 is a portion of a MEMS wafer containing one or more MEMS devices or structures. In such an embodiment, patterned top-level metal layer 104 may function as metal electrodes that are connected to one or more MEMS devices or structures of the MEMS wafer. In another alternative embodiment, substrate 102 may be without any MEMS devices/structures or electronic circuits. Such a substrate may be an interposer substrate or a package substrate. In some embodiments, interposer substrates, or package substrates, include through substrate interconnects.

In the first exemplary process, substrate 102 is made of silicon. However, in some embodiments, substrate 102 may be made of other materials. For example, substrate 102 may be, but not limited to, a wafer made of semiconductor material (e.g., SiGe, GaAsP, AlInAs, AlGaAs, GaInAs, GaInP, and GaInAsP), or a panel made of insulator material (e.g., sapphire, borosilicate glass, soda lime glass, and quartz).

In the first exemplary process, first passivation layer 106 is made of silicon oxide capable of outgassing at a temperature above room temperature. Such silicon oxide material is formed using a high-density plasma (HDP) tool and outgasses at temperatures above 300° C. In the first exemplary process, the thickness of silicon oxide material is typically 1000 nm. The outgassing rate of the silicon oxide formed using an HDP tool can be adjusted by changing the deposition process such as chamber pressure, gas flow rates, and power. It is noted that silicon oxide deposited with an HDP tool is typically used in micro-fabricated devices for its superior dielectric properties rather than for its outgassing capability. Alternatively, first passivation layer 106 may be made of any material capable of outgassing, such as, but not limited to, polyimide, poly (para-xylylene) derivatives, and other organic compounds. First passivation layer 106 may also be made of a plurality of layers where at least one layer is capable of outgassing.

In the first exemplary process, second passivation layer 108 is made of silicon nitride. The silicon nitride layer may be formed using any standard deposition process, such as, but not limited to atomic layer deposition (ALD), plasma enhanced chemical vapor deposition (PECVD), low pressure chemical vapor deposition (LPCVD), chemical vapor deposition (CVD), magnetron sputtering, thermal evaporation, or e-beam evaporation. Additionally, second passivation layer 108 acts as an outgassing barrier layer. In other words, second passivation layer 108 may prevent or reduce the amount of outgassing when formed over an outgassing material, such as first passivation layer 106. In the first exemplary process, the thickness of the silicon nitride layer is about 200-500 nm. Alternatively, second passivation layer 108 may not affect the outgassing rate when formed over an outgassing material. Second passivation layer 108 may also be made of any other material including dielectric material such as, but not limited to, silicon oxide, or a non-outgassing polymer-based material. Second passivation layer 108 may also be made of a plurality of layers.

Materials of first and second passivation layers 106, 108 may be disposed using any deposition process, such as, but not limited to ALD, PECVD, LPCVD, CVD, magnetron sputtering, thermal evaporation, or c-beam evaporation. Alternatively, first and second passivation layers 106, 108 may be disposed using a spin-coating process in combination with one or more baking processes. A person skilled in the art would recognize that a limited thermal budget may be available for processes described in the present disclosure, depending on the devices or structures that are formed in or on the first and/or second substrates prior to the described processes. Therefore, a person skilled in the art would be able to choose a suitable fabrication process that would not damage the devices or structures of the first and/or second substrates. For example, in the first exemplary process, substrate 102 is a portion of a wafer containing CMOS circuits; in such an embodiment, a person skilled art may choose to use a PECVD tool (typically considered to be a low-temperature tool), rather than an LPCVD tool (typically considered to be a high-temperature tool), to deposit first and/or second passivation layers 106, 108.

Figure 2:
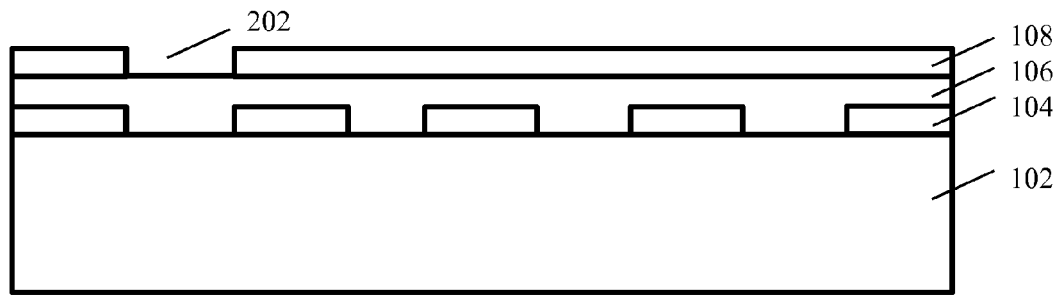
FIG. 2 shows the structure of FIG. 1 after forming an opening in a first portion of the second passivation layer.

FIG. 2 shows the structure of FIG. 1 after forming an opening 202 in a first portion of second passivation layer 108 to exposes a portion of a surface of first passivation layer 106. Opening 202 is formed in a region where an enclosure with a higher pressure is to be formed. In the first exemplary process, opening 202 is formed by etching the first portion of second passivation layer 108 using any etching method suitable for etching silicon nitride. For example, a dry etch process such as, but not limited to, reactive ion etching (RIE) may be performed to remove the portion of silicon nitride to form opening 202. In an alternative embodiment, etching solutions may also be used. The etching process is stopped once the portion of the surface of the first passivation layer 106 is exposed. The etch process may be configured (or etchant solution may be selected) such that the etch rate of the second passivation layer is greater than the etch rate of the first passivation layer. Such configuration may increase the process window and may allow for a larger process parameter (e.g., etch duration) variation. Additionally, or alternatively, a conventional end-point detection technique or tool may be used to determine whether the portion of the surface of first passivation layer 106 is exposed.

Figure 3:
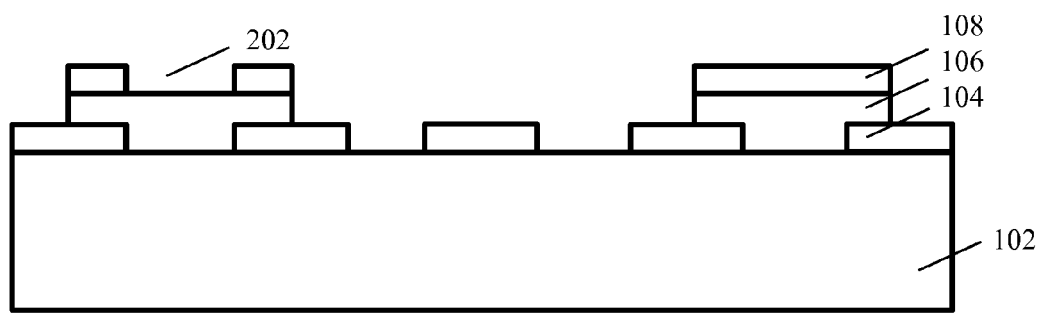
FIG. 3 shows the structure of FIG. 2 after patterning the second and first passivation layers to expose portions of the patterned top-level metal layer.

FIG. 3 shows the structure of FIG. 2 after patterning second and first passivation layers 108, 106 to expose portions of patterned top-level metal layer 104 and a portion of substrate 102. In the first exemplary process, the patterning of second and first passivation layers 108, 106 can be performed by using photolithography to form a patterned mask layer over second passivation layer 108 and by using an etch process to remove the portions of the second and the first passivation layers not covered by the mask layer. In the first exemplary process, a single etch process is used to remove both materials of second and first passivation layers 108, 106. The passivation layers may be etched using any dry etch tool, such as, but not limited to, RIE, or any suitable etching solution. Alternatively, a plurality of etch processes may be used to remove each passivation layer. For example, a first type of etching solution (or a first dry etch process) may be used to etch the material of the second passivation layer 108, and a second type of etching solution (or a second dry etch process) may be used subsequently to etch the material of first passivation layer 106.

In the first exemplary process, second passivation layer 108 can act as an outgassing barrier layer, therefore a portion of second and first passivation layers 108, 106 may remain in regions where an enclosure with a lower pressure is to be formed. In an alternative embodiment where second passivation layer 108 does not act as an outgassing barrier, second and first passivation layers 108, 106 in regions where an enclosure with a lower pressure is to be formed is removed.

Figure 4A:
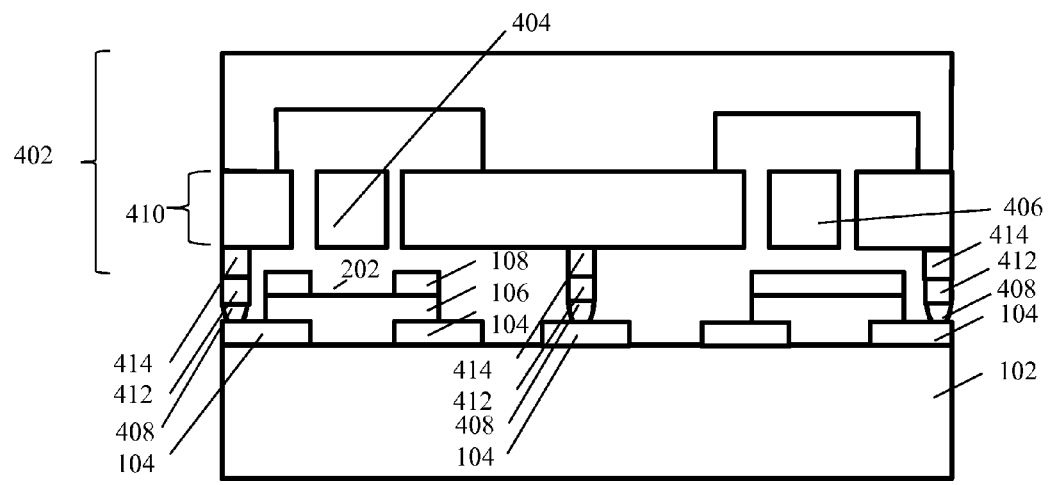
FIG. 4A shows the structure of FIG. 3 after bonding a second substrate and the first substrate to each other.

FIG. 4A shows the structure of FIG. 3 after bonding a second substrate 402 and first substrate 102 to each other to form a plurality of hermetically sealed enclosures. In the first exemplary process, second substrate 402 is a MEMS wafer, which includes a MEMS structural layer 410, a stand-off 414, and a patterned germanium layer 412. A first MEMS structure 404 and a second MEMS structure 406 are formed in MEMS structural layer 410, and stand-off 414 is disposed on MEMS structural layer 410. Patterned germanium layer 412 is disposed on stand-off 414. In the first exemplary process, first MEMS structure 404 is a part of a MEMS accelerometer and second MEMS structure 406 is a part of a MEMS gyroscope. FIG. 4A shows a bonding material 408 interposed between patterned germanium layer 412 of second substrate 402 and patterned top-level metal layer 104 of first substrate 102. Bonding material 408 forms one or more hermetic seals between the first and second enclosures and as well as between the enclosures and the ambient surrounding the entire structure. Optionally, an electrical connection may be made between first and second substrates 102, 402 through bonding material 408.

Figure 4B:
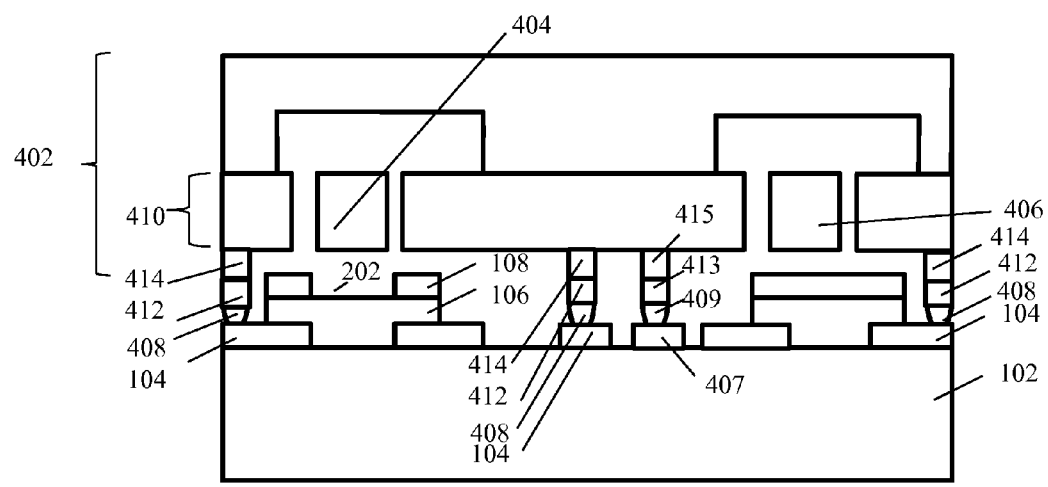
FIG. 4B shows an alternative structure that is similar to the structure illustrated by FIG. 4A, but with an additional stand-off, an additional patterned germanium structure, an additional patterned top-level metal layer, and an additional bonding material.

FIG. 4B shows an alternative structure that is similar to the structure illustrated by FIG. 4A, but with an additional stand-off 415, an additional patterned germanium structure 413, an additional patterned top-level metal structure 407, and an additional bonding material 409. These additional structures provide an electrical connection between first and second substrates 102, 402 and are formed in the second enclosure. Alternatively or additionally, these structures may be formed in the first enclosure and/or outside the first and second enclosures. Additional stand-off 415, additional patterned germanium structure 413, additional patterned top-level metal structure 407, and additional bonding material 409 are formed using the same process as (and at the same time as) stand-off 414, patterned germanium layer 412, patterned top-level metal layer 104, and bonding material 408, respectively.

Figure 4C:
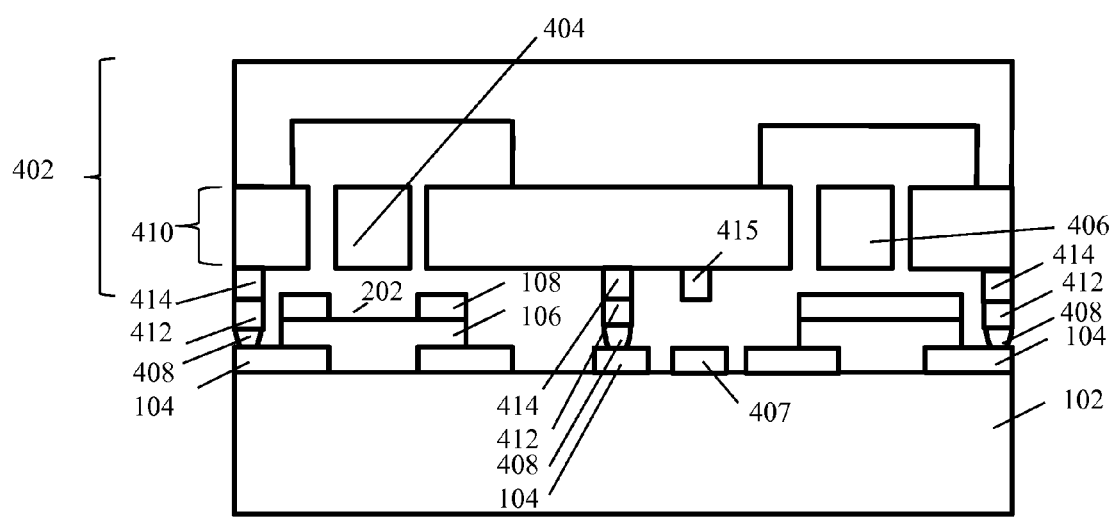
FIG. 4C shows an alternative structure that is similar to the structure illustrated by FIG. 4B, but without additional patterned germanium structure and additional bonding material.

FIG. 4C shows an alternative structure that is similar to the structure illustrated by FIG. 4B, but without additional patterned germanium structure 413 and additional bonding material 409. The missing additional patterned germanium structure 413 prevents formation of additional bonding material 409; therefore, electrical connection between additional stand-off 415 and additional top-level metal structure 407 is not established. Alternatively, the structure of FIG. 4C may include additional patterned germanium structure 413 of FIG. 4B but without additional patterned top-level metal structure 407 of FIG. 4B to prevent formation of additional bonding material 409.

In FIG. 4A, bonding material 408 is an aluminum-germanium eutectic alloy formed from a portion of patterned top-level metal layer 104 and a portion of patterned germanium layer 412. Optionally, patterned top-level metal layer 104 and germanium layer 412 may each comprise a plurality of materials. For example, germanium layer 412 may include, in addition to the germanium, materials similar to an under bump metallization (UBM) to promote adhesion of the eutectic material to first and second substrates 106, 108. In an alternative embodiment, first and second substrate 102, 402 may be bonded using direct bonding without bonding material 408. In such an embodiment, a recess in one or both of the substrates may be formed to increase the space between first and second substrates 102, 402.

In an alternative embodiment, second substrate 402 is a portion of a wafer containing electronic circuits such as, but not limited to, CMOS circuits. In another alternative embodiment, second substrate 402 is without any MEMS device or electronic circuits. Such a substrate may be an interposer substrate or a package substrate containing through substrate interconnects.

Figure 15:
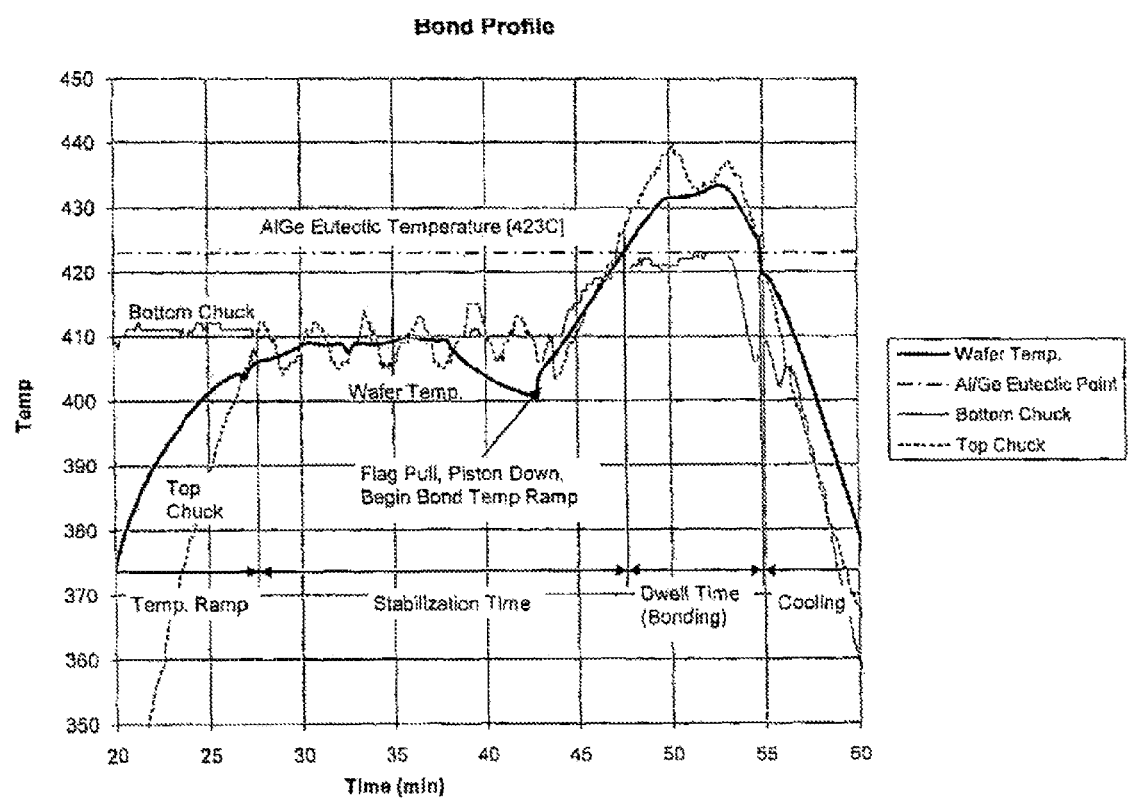
FIG. 15 is an exemplary reflow process for forming a bonding material comprising aluminum-germanium eutectic material.

Still referring to FIG. 4A, bonding material 408 is formed from a portion of patterned top-level metal layer 104 on first substrate 102 and a portion of patterned germanium layer 412 on second substrate 402. To form bonding material 408, the two layers are aligned, brought into contact, and reflowed to form bonding material 408 comprised of aluminum-germanium eutectic material. In FIG. 4A, only portions of patterned top-level metal layer 104 and germanium layer 412 are converted to bonding material 408, and some of patterned top-level metal layer 104 and germanium layer 412 remain after the bonding process. Typically, a bonding force (e.g., 60,000N) is applied during the bonding process. As discussed above, top-level metal layer 104 is the top metal layer made during BEOL manufacturing processes and is substantially made of aluminum; a typical ratio of aluminum to silicon to copper in the layer is 97.5:2:0.5, and the thickness is about 500 nm to 1500 nm. The patterned germanium layer is substantially made of germanium and is about 100 nm to 700 nm thick. The patterned germanium is deposited by sputtering. An exemplary temperature profile for the aluminum-germanium eutectic reflow process is shown in FIG. 15.

In some alternative embodiments, bonding material 408, patterned top-level metal layer 104, and/or patterned germanium layer 412 may not be present. In these embodiments, a patterned sealing layer may be disposed on second substrate 402 initially. Alternatively, the patterned sealing layer may be initially disposed on first substrate 102. The patterned sealing layer may be any material capable of forming hermetic seals and bonding first substrate 102 to second substrate 402 without damaging devices or structures of the two substrates. For example, the patterned sealing layer may be lead-free eutectic solder material or glass frit. The patterned sealing layer may be disposed using any suitable deposition method, such as, but not limited to, electroplating. It is noted that these bond layers should be formed from non-outgassing materials.

In the first exemplary process, the bonding process also induces outgassing of first passivation layer 106 at the same time. In other words, the heat applied during the bonding process also induces the outgassing of first passivation layer 106. First passivation layer 106, made of the HDP silicon oxide, outgasses hydrogen. Optionally, additional heating may be performed to further induce outgassing of first passivation layer 106 to further increase the pressure in one or more enclosures.

In the first exemplary process, bonding material 408 is disposed between first and second substrates 102, 402 such that two hermetically sealed enclosures are formed. The first enclosure encapsulates first MEMS structure 404 and patterned first and second passivation layers 106, 108 with opening 202. The second enclosure encapsulates second MEMS structure 406 and a second patterned first and second passivation layers 106, 108. In the first exemplary process, the second patterned first and second passivation layers 106, 108 do not include any opening in second passivation layer 108. Since outgassing of first passivation layer 106 is not inhibited because of opening 202 in the first enclosure, the pressure inside the first enclosure is higher than the pressure inside the second enclosure.

It is noted that the pressure and the gas inside the second enclosure may be substantially the same as the pressure and the gas content of the bond chamber in which the bonding process is performed.

In the first exemplary process, bonding material 408 is positioned on the exposed portion of patterned top-level metal layer 104 during and after the bonding process.

The higher pressure of the first enclosure compared to the second enclosure can be achieved by alternative embodiments. In an alternative embodiment, first and second passivation layers 106, 108 may be completely removed in the second enclosure. In such an embodiment, second passivation layer 108 may also be capable of outgassing to increase the volume of outgassing in the first enclosure to further increase the pressure of the first enclosure. In another alternative embodiment, the second patterned first and second passivation layers 106, 108 in the second enclosure may include a second opening in the second passivation layer 108. In such an embodiment, the size of the second opening in the second enclosure is smaller than opening 202.

While the illustrative embodiment of FIGS. 1-4 only shows two enclosures with two different pressures, it would be obvious to a person skilled in the art having the benefit of the present disclosure to form integrated MEMS devices with three or more enclosures and/or devices with three different pressures.

Second Exemplary Process

Figure 5:
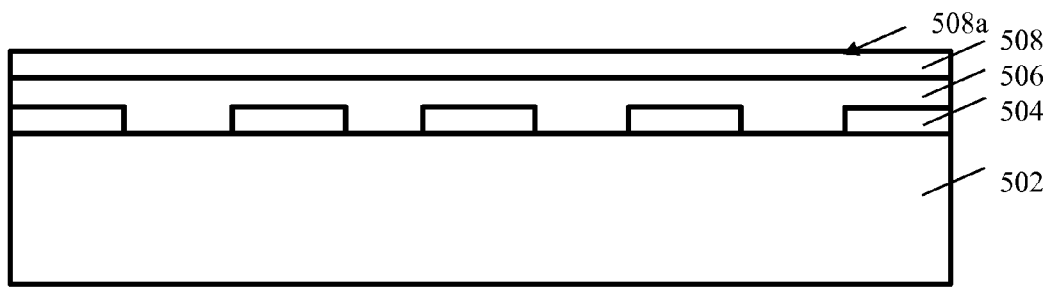
FIG. 5 is a cross-sectional representation of partially fabricated integrated MEMS devices having a first substrate in accordance with a second exemplary process.

FIG. 5 is a cross-sectional representation of partially fabricated integrated MEMS devices having a first substrate 502 in accordance with a second exemplary process. The structure of FIG. 5 is similar to the structure of FIG. 1 except that first passivation layer 506 of FIG. 4A may or may not be capable of outgassing at an elevated temperature and that second passivation layer 508 has a top surface 508*a*.

Figure 6:
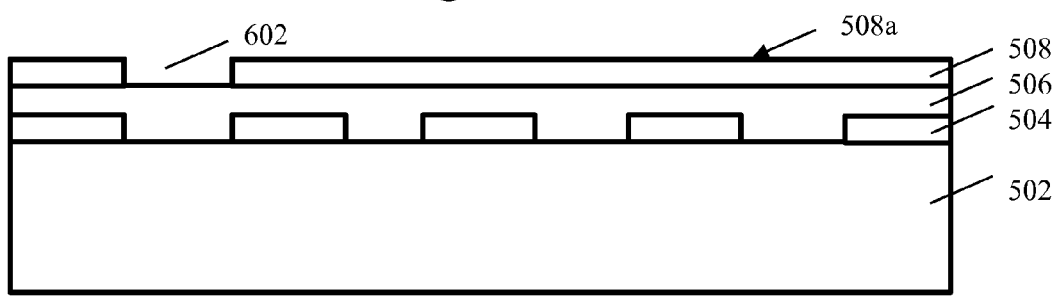
FIG. 6 shows the structure of FIG. 5 after forming an opening in a first portion of the second passivation layer.

FIG. 6 shows the structure of FIG. 5 after forming an opening 602 in the first portion of second passivation layer 508. The process for forming opening 602 is similar to the process for forming opening 202.

Figure 7:
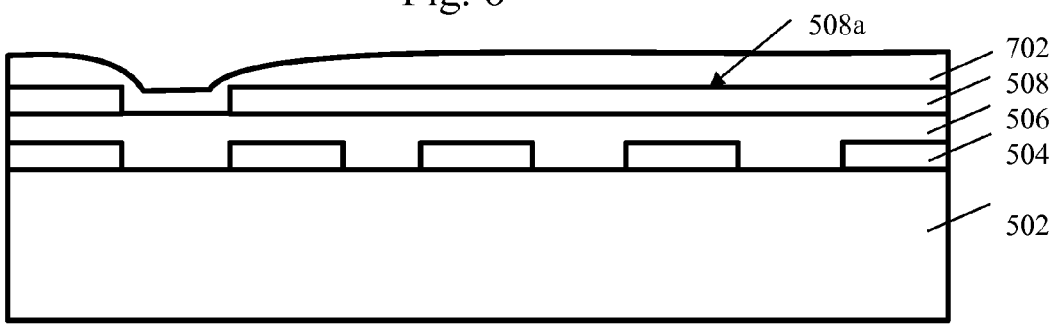
FIG. 7 shows the structure of FIG. 6 after forming a conformal layer of material over the top surface of the second passivation layer and over the exposed portion of the first passivation layer.

FIG. 7 shows the structure of FIG. 6 after forming a conformal layer of material 702 over top surface 508*a* of second passivation layer 508 and over the exposed portion of the first passivation layer 506. Conformal layer of material 702 may be disposed using any suitable deposition method. For example, PECVD, LPCVD, CVD process, magnetron sputtering, thermal evaporation, or e-beam evaporation, may be used to deposit the material. In the second exemplary process, conformal layer of material 702 is disposed substantially conformally over second passivation layer 508 and over the exposed portion of first passivation layer 506.

Figure 8:
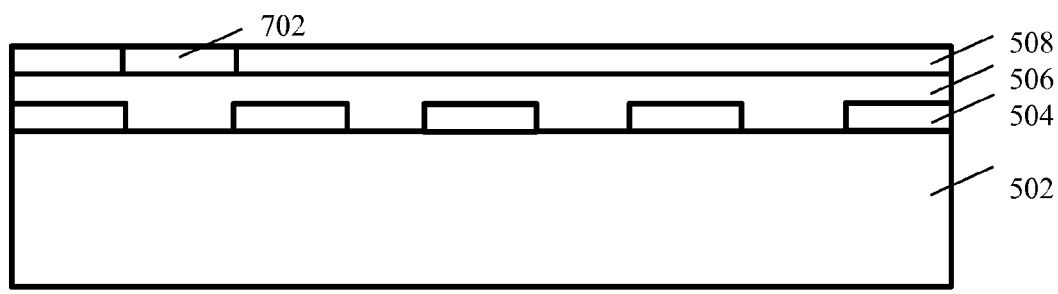
FIG. 8 shows the structure of FIG. 7 after planarizing the conformal layer of material.

FIG. 8 shows the structure of FIG. 7 after planarizing conformal layer of material 702. In the second exemplary process, the planarization is performed by a chemical mechanical polishing (CMP) process using second passivation layer 406 as a polish-stop layer. In an alternative embodiment, the planarization may be performed by mechanical-only grinding and polishing processes. In the embodiment of FIG. 8, the height of the remaining conformal layer of material 702 is substantially the same as second passivation layer 508. In another alternative embodiment, conformal layer of material 702 may be removed using a photolithography and a dry or wet etch process. In such an embodiment, the thickness of the remaining conformal layer of material 702 may be different from the thickness of second passivation layer 508.

Figure 9:
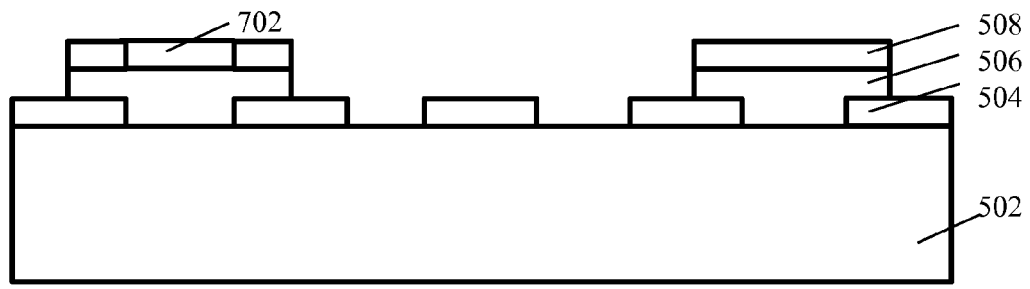
FIG. 9 shows the structure of FIG. 8 after patterning the second and first passivation layers to expose portions of the patterned top-level metal layer.

FIG. 9 shows the structure of FIG. 8 after patterning second passivation layer 508 and first passivation layers 506 to expose portions of the patterned top-level metal layer 504 and portions of substrate 502. The patterning process of FIG. 9 is similar to the patterning process described for FIG. 3.

Figure 10:
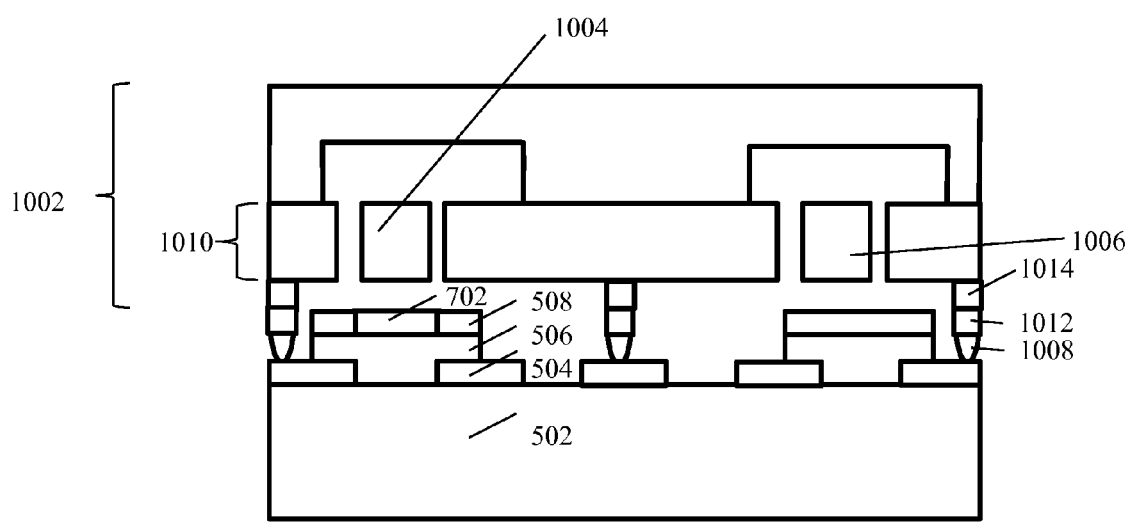
FIG. 10 shows the structure of FIG. 9 after bonding a second substrate and the first substrate to each other.

FIG. 10 shows the structure of FIG. 9 after bonding a second substrate 1002 and first substrate 502 to each other. The bonding process is similar to the bonding process described for FIG. 4A except that the bonding process of FIG. 10 induces conformal layer of material 702 to outgas.

Exemplary Methods

Figure 11:
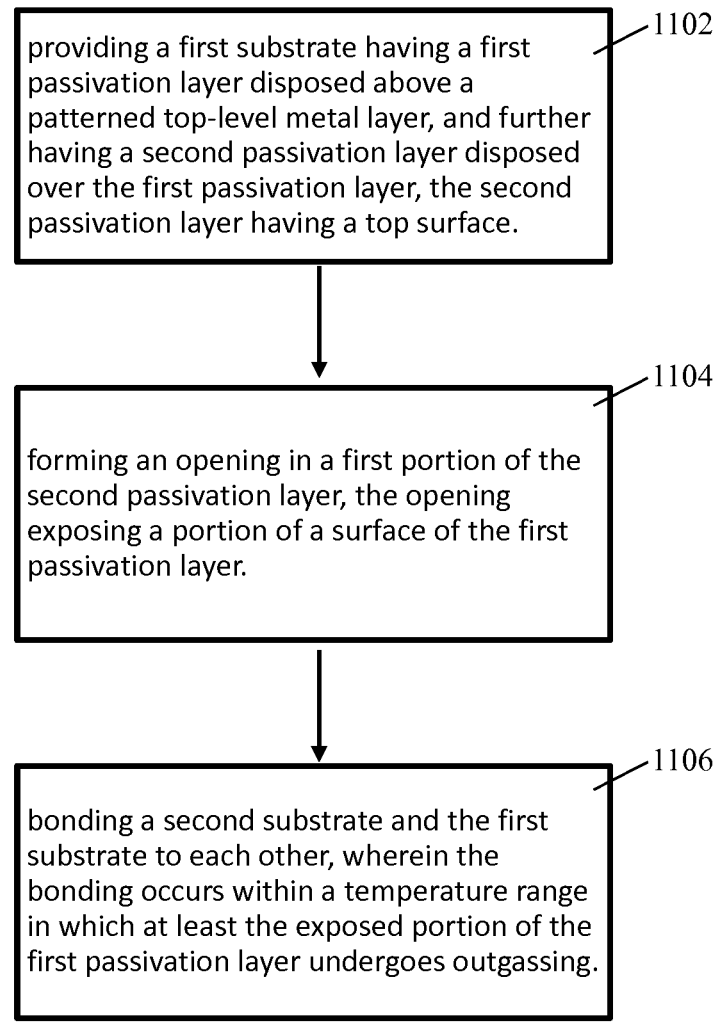
FIG. 11 is a flow diagram of an exemplary manufacturing method.

FIG. 11 is a flow diagram of an exemplary manufacturing method. At a step 1102, a first substrate is provided. The first substrate has a first passivation layer disposed above a patterned top-level metal layer, and the first substrate also has a second passivation layer disposed over the first passivation layer. The second passivation layer has a top surface. At a step 1104, an opening in a first portion of the second passivation layer is formed. The opening exposes a portion of a surface of the first passivation layer. At a step 1106, a second substrate and the first substrate are bonded to each other. The bonding step occurs within a temperature range in which the first passivation layer undergoes outgassing.

Figure 12:
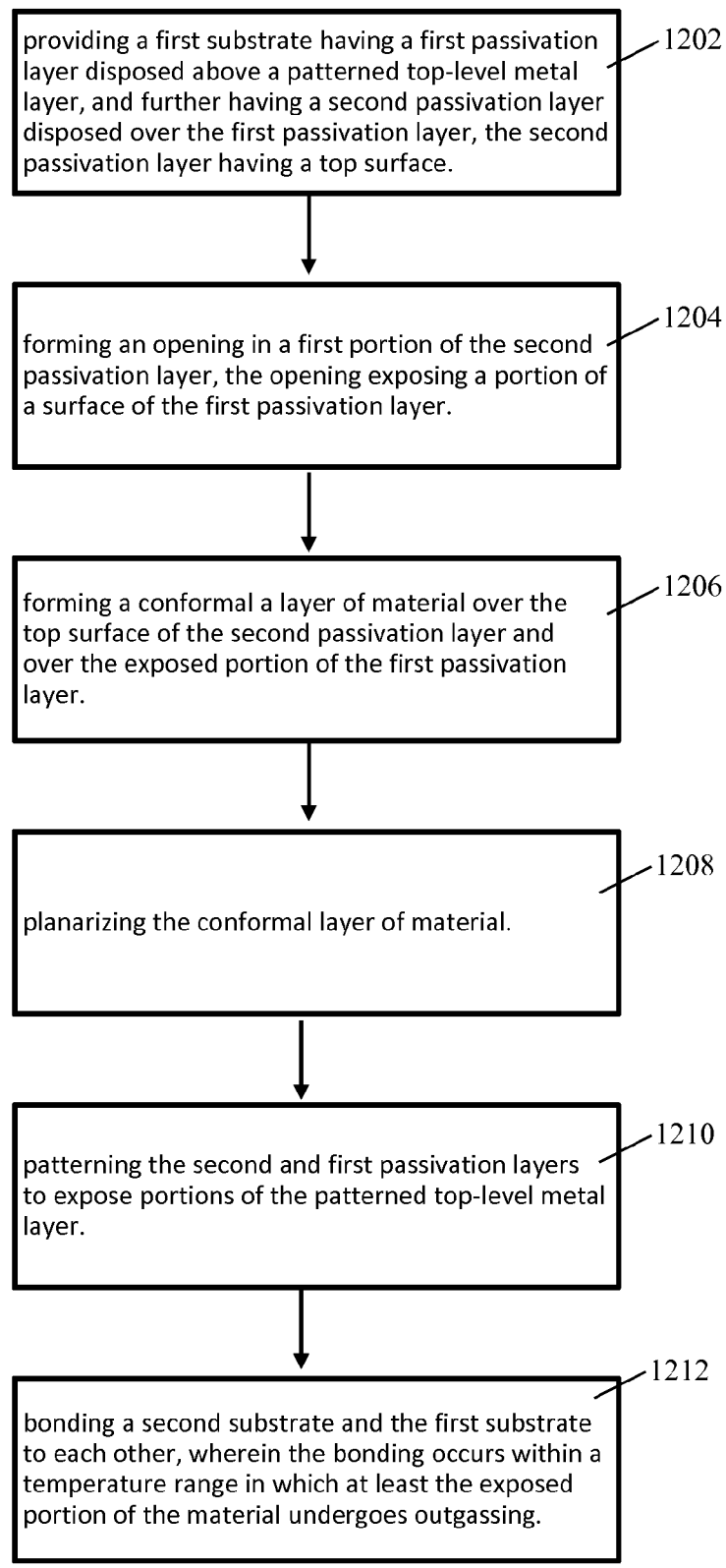
FIG. 12 is a flow diagram of another exemplary manufacturing method.

FIG. 12 is a flow diagram of another exemplary manufacturing method. At a step 1202, a first substrate is provided. The first substrate has a first passivation layer disposed above a patterned top-level metal layer, and the first substrate also has a second passivation layer disposed over the first passivation layer. The second passivation layer has a top surface. At a step 1204, an opening in a first portion of the second passivation layer is formed. The opening exposes a portion of a surface of the first passivation layer. At a step 1206, a conformal a layer of material is formed over the top surface of the second passivation layer and over the exposed portion of the first passivation layer. At a step 1208, the conformal layer of material is planarized. At a step 1210, the second and first passivation layers are patterned to expose portions of the patterned top-level metal layer. At a step 1212, a second substrate and the first substrate are bonded to each other. The bonding step occurs within a temperature range in which the first passivation layer undergoes outgassing.

Figure 13:
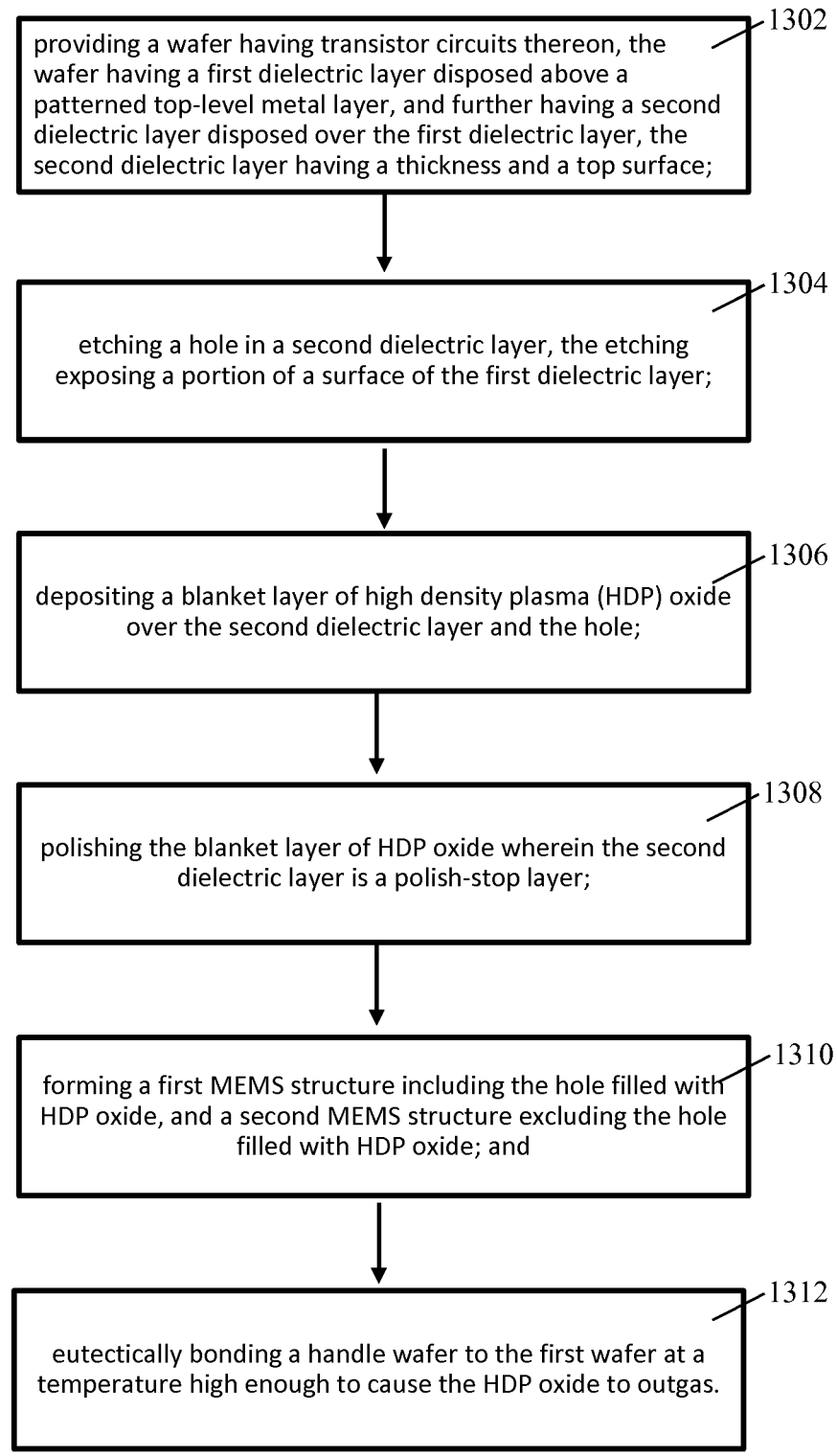
FIG. 13 is a flow diagram of an exemplary method for forming a plurality of MEMS-based sensors having individually set enclosure pressures.

FIG. 13 is a flow diagram of an exemplary method of forming a plurality of MEMS-based sensors having individually set cavity pressures. At a step 1302, a wafer having transistor circuits thereon is provided. The wafer has a first dielectric layer disposed above a patterned top-level metal layer, the wafer also has a second dielectric layer disposed over the first dielectric layer. The second dielectric layer has a thickness and a top surface. At a step 1304, a hole in a second dielectric layer is etched. The etching step exposes a portion of a surface of the first dielectric layer. At a step 1306, a blanket layer of high density plasma (HDP) oxide is deposited over the second dielectric layer and the hole. At a step 1308, the blanket layer of HDP oxide is polished using the second dielectric layer as a polish-stop layer. At a step 1310, a first MEMS structure and a second MEMS structure are formed. The first MEMS structure includes the hole filled with HDP oxide and the second MEMS structure excludes the hole filled with HDP oxide. At a step 1312, a handle wafer is eutectically bonded to the first wafer at a temperature high enough to cause the HDP oxide to outgas.

Exemplary Electronic Device

Figure 14:
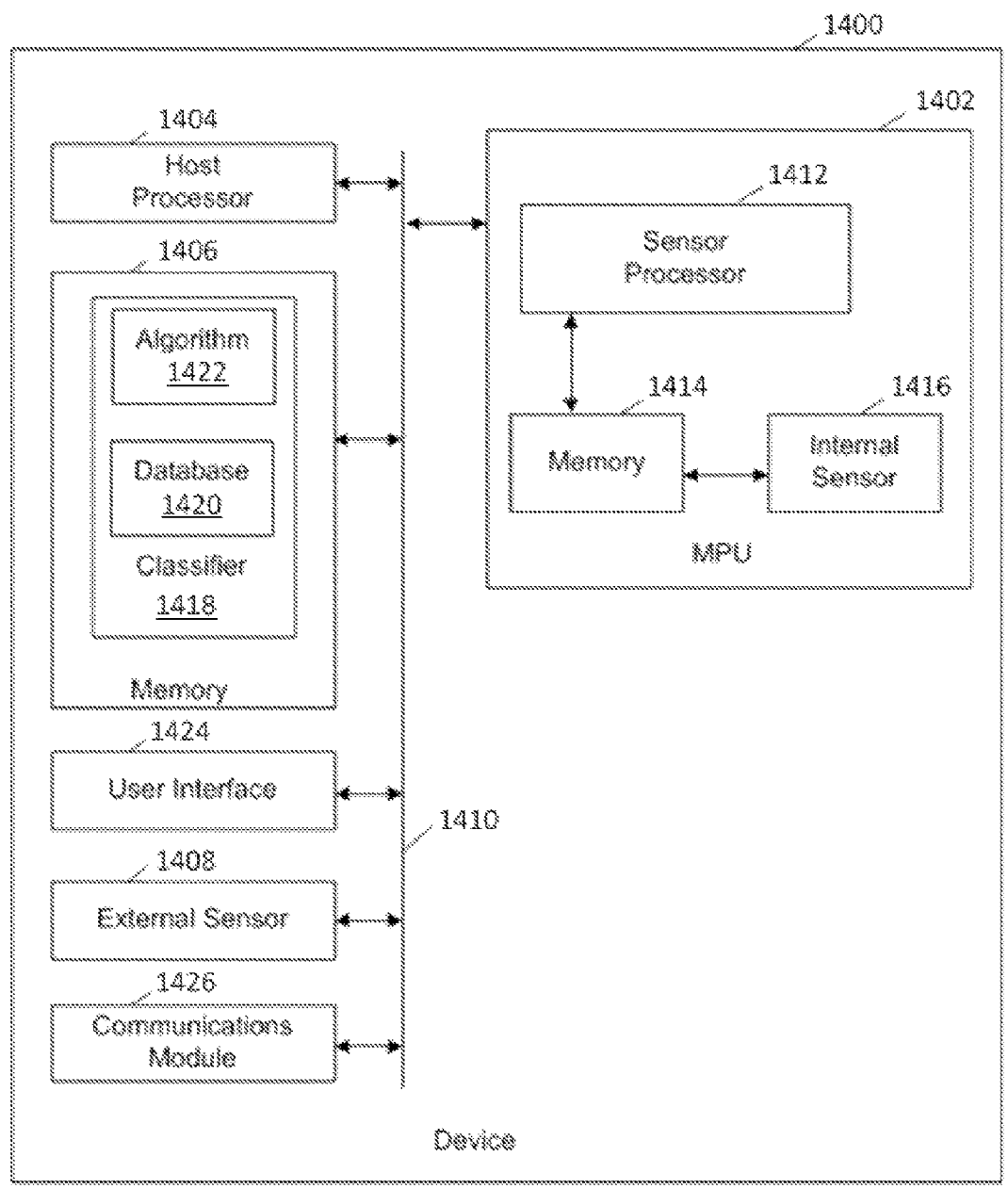
FIG. 14 is a high-level block diagram of an exemplary electronic device.

Details regarding one embodiment of an electronic device 1400 including features of this disclosure are depicted as high-level schematic blocks in FIG. 14. As shown, device 1400 includes MPU 1402, application or host processor 1404, application memory 1406, and external sensor 1408. Application processor 1404 may be configured to perform the various computations and operations involved with the general function of device 1400. Application processor 1404 may be coupled to MPU 1402 through any suitable bus or interfaces, such as a peripheral component interconnect express (PCIe) bus, a universal serial bus (USB), a universal asynchronous receiver/transmitter (UART) serial bus, a suitable advanced microcontroller bus architecture (AMBA) interface, a serial digital input/output (SDIO) bus, or other equivalent. Application memory 1406 may include programs, drivers or other data that utilize information provided by MPU 1402.

In this embodiment. MPU 1402 is shown to include sensor processor 1412, memory 1414 and internal sensor 1416. Memory 1414 may store algorithms, routines or other instructions for processing data output by sensor 1416 or sensor 1408 as well as raw data and motion data.

Internal sensor 1416 may include one or more sensors, such as accelerometers, gyroscopes, magnetometers, pressure sensors, microphones and other sensors. Likewise, external sensor 1408 may include one or more sensors, such as accelerometers, gyroscopes, magnetometers, pressure sensors, microphones, proximity, and ambient light sensors, and temperature sensors among others sensors.

In some embodiments, sensor processor 1412 and MPU 1402 are formed on different substrates and in other embodiments; they reside on the same substrate. In yet other embodiments, a sensor fusion algorithm that is employed in calculating orientation of the device is performed externally to sensor processor 1412 and MPU 1402, such as by application processor 1404. In still other embodiments, the sensor fusion is performed by MPU 1402. More generally, device 1400 incorporates MPU 1402 as well as application processor 1404 and application memory 1406 in this embodiment. However, application processor 1404 and application memory 1406 may be provided on a separate device and may communicate with MPU 1402 using any suitable wireless or wired bus or interface technology, including WiFi®, BLUETOOTH®, ZigBee®, ANT (wireless protocol stack by ANT Wireless for use in the 2.4 GHz ISM band), peripheral component interconnect express (PCIe) bus, an Inter-Integrated Circuit (I2C) bus, a universal serial bus (USB), a universal asynchronous receiver/transmitter (UART) serial bus, a suitable advanced microcontroller bus architecture (AMBA) interface, a serial digital input output (SDIO) bus or the like.

CONCLUSION

The embodiments described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments within the spirit and scope of the disclosure. Further, the claims should be defined only in accordance with their recitations and their equivalents.

It is to be appreciated that the Detailed Description section, and not the Abstract of the Disclosure, is intended to be used to interpret the claims. The Abstract of the Disclosure may set forth one or more, but not all exemplary embodiments, of the disclosure. Thus, the Abstract of the Disclosure is not intended to limit the disclosure or the subjoined claims in any way.

What is claimed is:

1. A manufacturing method, comprising:
providing a first substrate having a first passivation layer disposed above a patterned top-level metal layer, and further having a second passivation layer disposed over the first passivation layer, the second passivation layer having a top surface;
forming an opening in a first portion of the second passivation layer, the opening exposing a portion of a surface of the first passivation layer;
patterning the second and first passivation layers to expose portions of the patterned top-level metal layer; and
bonding a second substrate and the first substrate to each other;
wherein the bonding occurs within a temperature range in which at least the exposed portion of the first passivation layer undergoes outgassing.

* * * * *